United States Patent
Maenishi et al.

(10) Patent No.: US 10,058,020 B2
(45) Date of Patent: Aug. 21, 2018

(54) ELECTRONIC COMPONENT MOUNTING SYSTEM

(71) Applicant: Panasonic Intellectual Property Management Co., Ltd., Osaka (JP)

(72) Inventors: Yasuhiro Maenishi, Yamanashi (JP); Hagemu Yasojima, Yamanashi (JP); Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 273 days.

(21) Appl. No.: 14/864,139

(22) Filed: Sep. 24, 2015

(65) Prior Publication Data

US 2016/0128205 A1 May 5, 2016

(30) Foreign Application Priority Data

Nov. 5, 2014 (JP) ................................ 2014-224823

(51) Int. Cl.
- *H05K 13/08* (2006.01)
- *H05K 13/04* (2006.01)
- *H05K 13/02* (2006.01)

(52) U.S. Cl.
CPC ....... *H05K 13/0495* (2013.01); *H05K 13/021* (2013.01); *H05K 13/08* (2013.01)

(58) Field of Classification Search
CPC ... H05K 13/021; H05K 13/0495; H05K 13/08
See application file for complete search history.

(56) References Cited

U.S. PATENT DOCUMENTS

| | | | | |
|---|---|---|---|---|
| 5,908,282 A | * | 6/1999 | Onodera | H05K 13/0413 29/757 |
| 6,842,974 B1 | * | 1/2005 | Maenishi | H05K 13/0408 29/739 |
| 6,971,161 B1 | * | 12/2005 | Maenishi | H05K 13/04 29/739 |

(Continued)

FOREIGN PATENT DOCUMENTS

| | | | |
|---|---|---|---|
| JP | 2013235906 A | * 11/2013 | ............. H05K 13/08 |
| JP | 2014-86517 A | 5/2014 | |

*Primary Examiner* — Minh Trinh
(74) *Attorney, Agent, or Firm* — Pearne & Gordon LLP

(57) ABSTRACT

An electronic component mounting system includes: mounting line management apparatuses disposed in each of mounting lines and an integrated management apparatus connected to the mounting line management apparatuses. The integrated management apparatus includes a first collation unit which performs collation of an electronic component based on identification information for identifying the electronic component. The mounting line management apparatus includes a second collation unit which performs collation of the electronic component. When the identification information is read out by the identification information reading-out unit, the collation of the electronic component is performed by the first collation unit if the mounting line management apparatus can access the integrated management apparatus, and the collation of the electronic component is performed by the second collation unit if the mounting line management apparatus cannot access the integrated management apparatus.

6 Claims, 9 Drawing Sheets

(56) References Cited

U.S. PATENT DOCUMENTS

| | | | |
|---|---|---|---|
| 9,439,335 B2 * | 9/2016 | Maeda | H05K 13/0465 |
| 2009/0007424 A1 * | 1/2009 | Otake | H05K 3/1216 |
| | | | 29/840 |
| 2010/0050429 A1 * | 3/2010 | Maenishi | H05K 1/0269 |
| | | | 29/832 |
| 2013/0074326 A1 * | 3/2013 | Uekawa | H01L 21/677 |
| | | | 29/739 |

* cited by examiner

FIG. 5

| COMPONENT USE HISTORY DATA | | | |
|---|---|---|---|
| COMPONENT ID | COMPONENT TYPE | REMAINING NUMBER | LOCATION |
| | | | |
| | | | |
| | | | |
| | | | |
| | | | |
| | | | |

ELECTRONIC COMPONENT MOUNTING SYSTEM

CROSS-REFERENCES TO RELATED APPLICATION(S)

This application is based on and claims priority from Japanese Patent Application No. 2014-224823 filed on Nov. 5, 2014, the entire contents of which are incorporated herein by reference.

BACKGROUND

1. Field of the Invention

One or more embodiments of the present invention relate to an electronic component mounting system which mounts an electronic component onto a substrate.

2. Description of Related Art

In an electronic component mounting field, a mounting line which links a plurality of mounting-related apparatuses for executing operations for mounting an electronic component onto a substrate to each other is generally used. There is a case where a plurality of mounting lines are disposed in one floor in a production factory, and it is possible to perform mass production of mounted substrates by performing mounting work together in each mounting line. In the related art, since operation situations of each mounting line are integrally managed floor by floor, an electronic component mounting system which is configured by disposing mounting line management apparatuses (management system) in each mounting line, and by connecting the plurality of mounting line management apparatuses to an integrated management apparatus (integrated system) via a communication network, such as a LAN, is suggested (for example, refer to JP-A-2014-86517).

The mounting line management apparatus accesses the integrated management apparatus, and reads out production data which is necessary for producing the substrate, and in addition to this, sends mounting operation information received from the mounting line, such as the number of produced substrates or the number of used electronic components, to the integrated management apparatus. The integrated management apparatus stores the production data and component library data including identification information of the electronic component which are used in each mounting line, and in addition to this, collects and manages the operation information which is sent from each mounting line.

However, an electronic component mounting apparatus of the mounting-related apparatus which configures the mounting line mounts the electronic component supplied by a tape feeder onto the substrate. The tape feeder sends a carrier tape which accommodates a plurality of electronic components at an interval, and supplies each of the electronic components to a component picking-up position by a mounting head. The carrier tape is accommodated being wound around a supply reel (accommodating body), and a barcode label in which the identification information of the electronic component is recorded is attached to the supply reel. When the supply reel is mounted on the tape feeder, the identification information is read out from the barcode label by using a barcode reader provided in the mounting line. In addition, based on the identification information, collation work for determining whether or not the electronic component accommodated in the supply reel is incorrect, is performed. In the related art, the collation work is performed by the integrated management apparatus, and the identification information read out by the barcode reader is sent to the integrated management apparatus via the mounting line management apparatus. In addition, mounting work is performed after the collation work by the integrated management apparatus is completed.

SUMMARY

There is a case where the mounting line management apparatus and the integrated management apparatus are in a situation where a problem is generated and access therebetween is not possible, and there is also a concern that restoring work is performed over a long period of time due to such a reason, or the like. In such a situation, the mounting work can continue with respect to the electronic component in which the collation work is finished before access becomes impossible, but even when a new supply reel is brought into the mounting line, since the mounting line management apparatus cannot send the identification information read out by the barcode reader to the integrated management apparatus, it is not possible to perform the collation work by the integrated management apparatus. Therefore, there is a problem that the mounting work for the electronic component accommodated in the brought-in supply reel as a target cannot be performed until the mounting line management apparatus and the integrated management apparatus become in a state of being accessed by each other, and productivity remarkably deteriorates.

Here, an object of the present invention is to provide an electronic component mounting system which can continue producing a substrate without stopping an operation of a mounting line even when it is not possible to access an integrated management apparatus.

According to an aspect of the present invention, there is provided an electronic component mounting system, including: a plurality of mounting lines for mounting an electronic component onto a substrate; a plurality of mounting line management apparatuses which are disposed in each of the plurality of mounting lines, which store production data necessary for producing the substrate in the corresponding mounting line where the mounting line management apparatuses are disposed, which receive operation information from the corresponding mounting line, and which manage the corresponding mounting line; an integrated management apparatus which is connected to the plurality of mounting line management apparatuses via a communication network, which stores the production data in each of the plurality of mounting lines, which receives the operation information from the plurality of mounting line management apparatuses, and which integrally manages the plurality of mounting lines; and an identification information reading-out unit which reads out identification information for identifying the electronic component from a recording medium attached to an accommodating body that accommodates the electronic component, wherein the integrated management apparatus includes a first collation unit which performs collation of the electronic component accommodated in the accommodating body based on the identification information read out by the identification information reading-out unit, wherein each of the plurality of mounting line management apparatuses includes a second collation unit which performs collation of the electronic component accommodated in the accommodating body based on the identification information read out by the identification information reading-out unit, and wherein when the identification information is read out by the identification information reading-out unit, the collation of the electronic component is performed by the first collation unit if the mounting line management apparatus can access the integrated management apparatus, and the collation of the electronic component is performed by the second collation unit if the mounting line management apparatus cannot access the integrated management apparatus.

According to one or more embodiments of the present invention, it is possible to continue producing a substrate without stopping an operation of a mounting line even when it is not possible to access an integrated management apparatus.

BRIEF DESCRIPTION OF THE DRAWINGS

FIG. 5 is a view illustrating component use history data according to one embodiment of the present invention.

DETAILED DESCRIPTION

Figure 1:
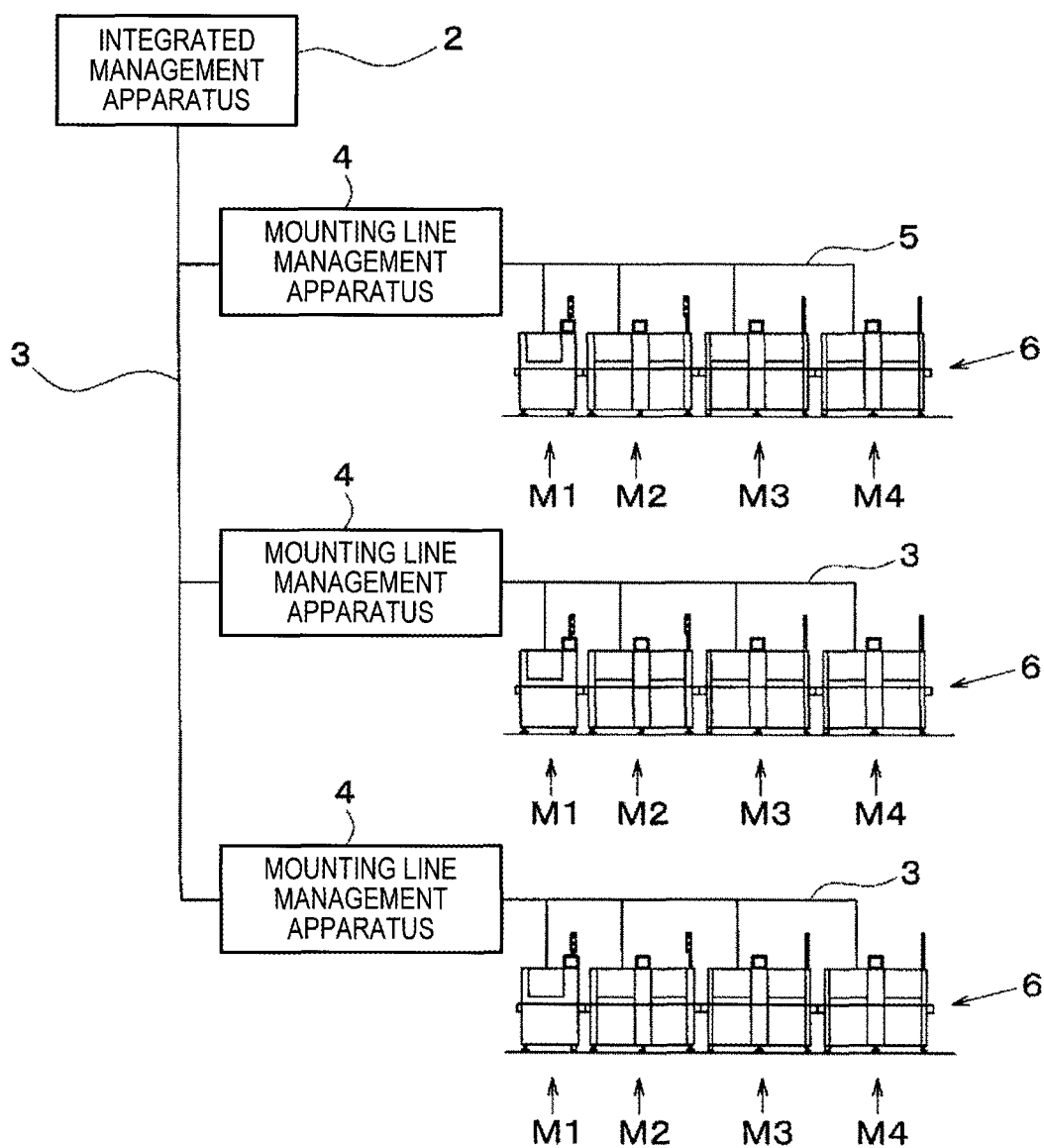
FIG. 1 is a configuration view of the entire electronic component mounting system according to one embodiment of the present invention.

First, with reference to FIG. 1, an electronic component mounting system according to one embodiment of the present invention will be described. An electronic component mounting system 1 has a function of producing a mounted substrate in which an electronic component is mounted on a substrate. The electronic component mounting system 1 includes an integrated management apparatus 2, a plurality of mounting line management apparatuses 4 which are connected to the integrated management apparatus 2 to be accessible via a communication network 3, such as a local area network (LAN), and a plurality of mounting lines 6 which are connected to each mounting line management apparatus 4 to be accessible via a component mounting apparatus 5.

Each of the integrated management apparatus 2 and the mounting line management apparatus 4 include a control device. The control device may include, e.g., a memory configured to store instructions; and at least one processor configured to execute the instructions to cause the integrated management apparatus 2 or the mounting line management apparatus 4 to perform at least one of the operations thereof. The integrated management apparatus 2 integrally manages various types of information handled by the electronic component mounting system 1, and collects and stores production data which is used in the production of the mounted substrate by the plurality of mounting lines 6, or information stored being dispersed in the plurality of mounting line management apparatuses 4. The mounting line management apparatus 4 manages various types of information handled by the mounting line 6 at a connection point, collects and stores information which is sequentially sent from the mounting line 6, and stores the data read out from the integrated management apparatus 2.

The mounting line 6 is configured by linking a plurality of mounting-related apparatuses for mounting the electronic component onto the substrate to each other in a carrying direction of the substrate. The mounting line 6 according to the embodiment includes, as the mounting-related apparatuses, a printing apparatus M1, and a plurality of electronic component mounting apparatuses M2, M3, and M4. The printing apparatus M1 prints a soldering paste on an electrode of the substrate. The electronic component mounting apparatuses M2 to M4 mount the electronic component onto the substrate on which the soldering paste is printed. In addition, the mounting line 6 may include at least one electronic component mounting apparatus.

Next, with reference to FIG. 2, the electronic component mounting apparatuses M2 to M4 will be described. Hereinafter, the carrying direction of the substrate is defined as an X direction, and a direction which is orthogonal to the X direction within a horizontal surface is defined as a Y direction. The electronic component mounting apparatuses M2 to M4 includes various types of mechanisms which will be described in the following on a base 8 which is covered with a cover member 7. On an upper surface of the base 8, a substrate carrying mechanism 9 which is provided with one pair of carrying conveyors that extend in the X direction is provided. The substrate carrying mechanism 9 carries and positions a substrate 10 to a predetermined mounting work position. At positions on both sides of the substrate carrying mechanism 9 in the Y direction, component supply units 11 are respectively provided. In the component supply units 11, a plurality of tape feeders 12 are disposed in a state of being aligned in the X direction.

The tape feeder 12 sends a carrier tape 14 which holds a plurality of electronic components 13 at an interval, and supplies the electronic component 13 to a component picking-up position by a suction nozzle 21 which will be described later. The carrier tape 14 is accommodated in a state of being wound around a supply reel 15, and the supply reel 15 is held to be freely rotatable by a reel holding member provided in a cart 16. The supply reel 15 is an accommodating body which accommodates the plurality of electronic components 13.

Figure 3:
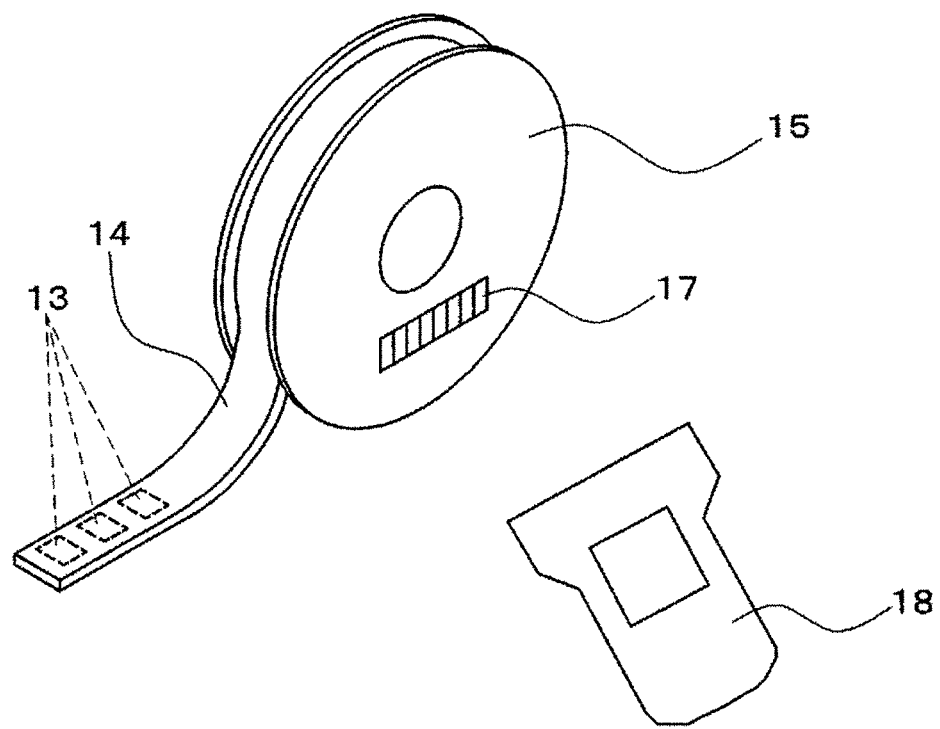
FIG. 3 is a view illustrating a structure of a barcode reader which is provided in the electronic component mounting system and a supply reel which is set in the electronic component mounting apparatus according to one embodiment of the present invention.

In FIG. 3, a barcode label 17 which functions as a recording medium is attached to a side surface of the supply reel 15. In the barcode label 17, a component ID (identification information) for identifying the electronic component 13 held by the carrier tape 14 which is accommodated in a state of being wound around the supply reel 15 is stored. In the component ID, the total number (initial value) of the electronic components 13 in a case where the supply reel 15 is not used is stored being associated with the component ID. In addition, instead of the barcode label 17, the recording medium which can read out the information from the outside may be attached to the supply reel 15.

In FIG. 3, the electronic component mounting apparatuses M2 to M4 are provided with a barcode reader 18 which is connected to the mounting line management apparatus 4 in a wireless or wired manner. The barcode reader 18 reads out the component ID by making a reading-out surface thereof face the barcode label 17. The read-out component ID is sent to the mounting line management apparatus 4, and used when managing the electronic component 13 accommodated in the supply reel 15, and determining whether or not a set position or selection of the supply reel 15 is incorrect. In this manner, the barcode reader 18 is an identification information reading-out unit which reads out the identification information for identifying the electronic component 13 from the recording medium which is attached to the accommodating body that accommodates the electronic component 13. In addition, an installation location of the barcode reader 18 is arbitrary, and the barcode reader 18 and the mounting line management apparatus 4 may be directly connected to each other, instead of via the electronic component mounting apparatuses M2 to M4.

Figure 2:
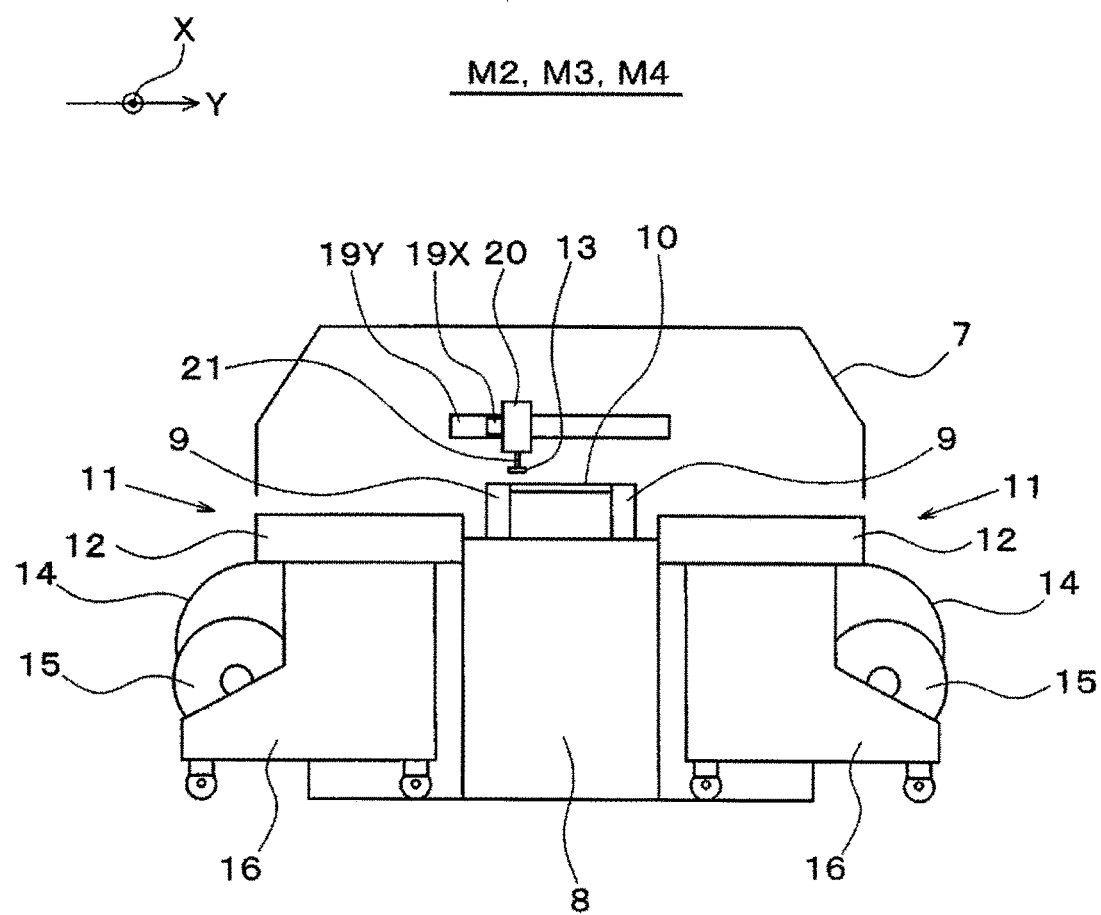
FIG. 2 is a view illustrating a structure of an electronic component mounting apparatus provided in the electronic component mounting system according to one embodiment of the present invention.

In FIG. 2, a Y-axis beam 19Y which extends in the Y direction is provided in an end portion of the base 8 in the X direction, and an X-axis beam 19X which extends in the X direction is provided to freely move in the Y-axis beam 19Y. In addition, a mounting head 20 is mounted on the X-axis beam 19X to freely move in the X direction. The Y-axis beam 19Y and the X-axis beam 19X move the mounting head 20 in the X direction and in the Y direction. The mounting head 20 is provided with a plurality of suction nozzles 21 which can suction the electronic component 13 accommodated in the supply reel 15. The suction nozzle 21 suctions and picks up the electronic component 13 supplied to the component picking-up position by the tape feeder 12, and mounts the electronic component 13 onto the substrate 10. In this manner, the electronic component mounting apparatuses M2 to M4 which are one kind of the mounting-related apparatuses included in the mounting line 6 pick up the electronic component 13 from the accommodating body and mount the electronic component 13 onto the substrate 10.

Figure 4:
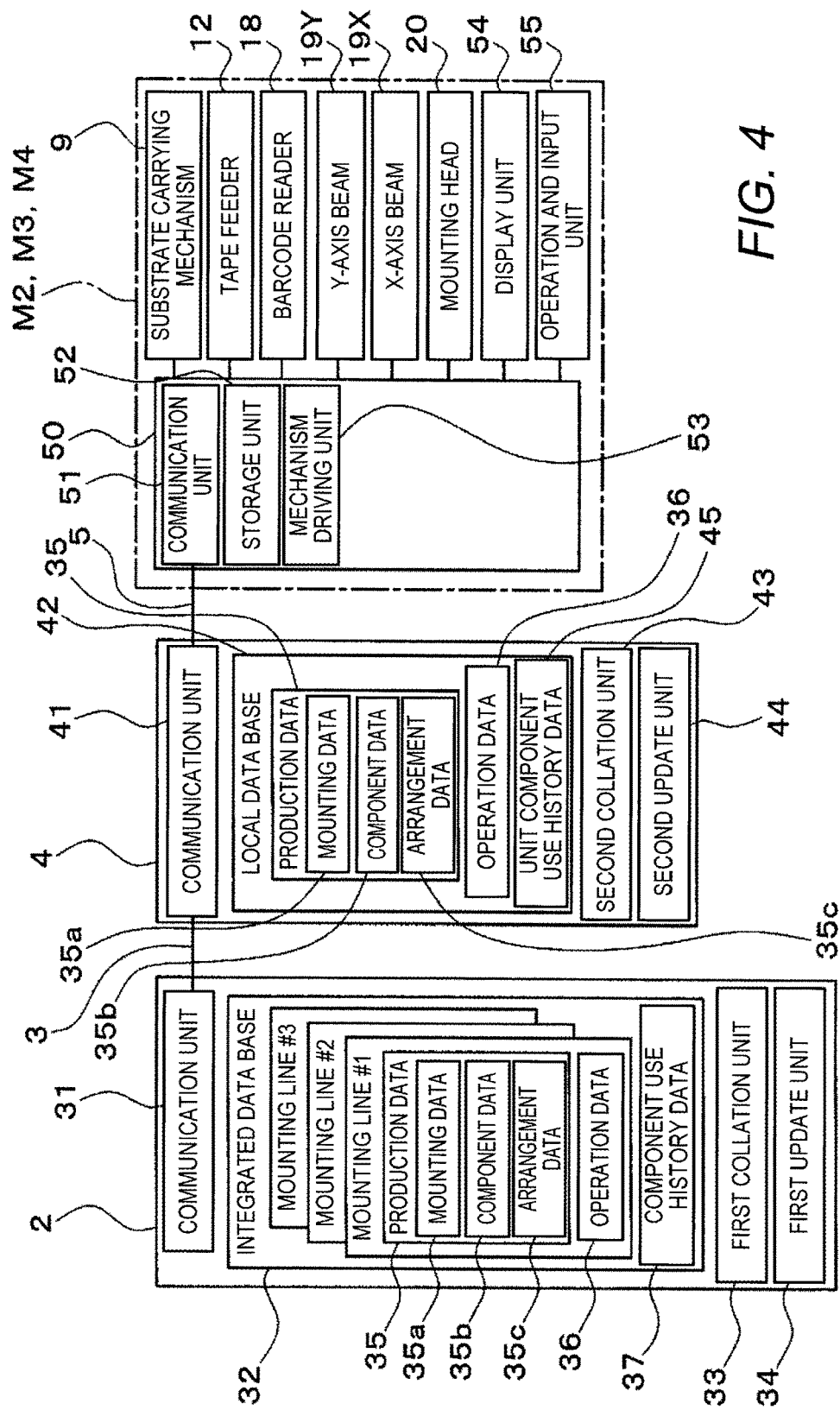
FIG. 4 is a block diagram illustrating a control system of the electronic component mounting system according to one embodiment of the present invention.

Next, with reference to FIG. 4, a configuration of a control system of the electronic component mounting system 1 will be described. The integrated management apparatus 2 includes a communication unit 31, an integrated data base 32, a first collation unit 33, and a first update unit 34. The mounting line management apparatus 4 includes a communication unit 41, a local data base 42, a second collation unit 43, and a second update unit 44. A control device 50 provided in the electronic component mounting apparatuses M2 to M4 includes a communication unit 51, a storage unit 52, and a mechanism driving unit 53. In addition, the control device 50 is connected to the substrate carrying mechanism 9, the tape feeder 12, the barcode reader 18, the Y-axis beam 19Y, the X-axis beam 19X, the mounting head 20, a display unit 54, and an operation and input unit 55.

The communication units 31 and 41 are connected to each other via the communication network 3, and in addition, the communication units 41 and 51 are connected to each other via the communication network 5. Therefore, it is possible to perform sending and receiving of various types of data between the integrated management apparatus 2, the mounting line apparatus 4, and the electronic component mounting apparatuses M2 to M4.

The integrated data base 32 (first storage unit) stores production data 35, operation data 36, component use history data 37 and the like. The production data 35 and the operation data 36 are stored in each mounting line 6 (#1 to #3). The production data 35 is configured of various types of data which are necessary for producing the mounted substrate, and includes mounting data 35a, component data 35b, and arrangement data 35c. The mounting data 35a is data for mounting the electronic component 13 onto the substrate 10, and includes an XY coordinate of the mounting position set on the substrate 10, and a mounting angle of the electronic component 13.

The component data 35b is data indicating a control parameter when mounting the electronic component 13 onto the substrate 10. Specifically speaking, the component data 35b includes the shape of the electronic component 13, a sending pitch of the carrier tape 14, a type of suction nozzle 21 used, and a speed parameter, such as a suction speed when the suction nozzle 21 suctions the electronic component 13, or a mounting speed when the electronic component 13 is mounted onto the substrate 10, in each component ID.

The arrangement data 35c is data indicating arrangement information of each tape feeder 12 disposed in the component supply unit 11, and is configured by combining the "component ID" and a "feeder address No.". The "feeder address No." indicates positional information of each tape feeder 12.

The operation data 36 is data indicating the operation information in the plurality of mounting-related apparatuses including the electronic component mounting apparatuses M2 to M4 in each mounting line 6. The operation information includes the number of produced mounted substrates, generated errors and frequency thereof, the number of electronic components 13 used in mounting the electronic component 13 onto the substrate 10, and the like.

In FIG. 5, the component use history data 37 is data indicating information regarding all of the electronic components 13 used as a target to be mounted in the plurality of mounting lines 6, and is configured by associating a "component type" 37b, a "remaining number" 37c, and a "location" 37d with a "component ID" 37a. The "component type" 37b indicates a type of the electronic component 13. The "remaining number" 37c indicates the number of remaining electronic components 13 accommodated in the supply reel 15, and the total number of the electronic components 13 accommodated in the supply reel 15 in a state before the electronic component 13 is used is set as the remaining number. The "location" 37d indicates information which specifies the electronic component mounting apparatuses M2 to M4 in which the supply reel 15 which accommodates the electronic component 13 that corresponds to the component ID is set, and information which specifies the position at which the supply reel 15 is set in the electronic component mounting apparatuses M2 to M4. In this manner, the first storage unit (integrated data base 32) stores the information regarding the electronic component 13 accommodated in the supply reel 15 which is a target to be mounted in each of the plurality of mounting lines 6 in association with the identification information (component ID), in each accommodating body. In addition, the first storage unit stores the information regarding the number of remaining electronic components 13 accommodated in the supply reel 15.

Based on the arrangement data 35c, the first collation unit 33 performs collation between the component ID sent from the mounting line management unit 4 and the component ID combined with the feeder address No. of the tape feeder 12 which is supposed to set the supply reel 15 to which the barcode label 17 having the component ID stored therein is attached. As a result of collation, when the two component IDs do not match each other, the first collation unit 33 determines that the collation is not OK. In other words, when the operation of collation is normally performed, but the component ID which is not accommodated in the arrangement data 35c is read out, the first collation unit 33 determines that the collation is not OK. In addition, when the two component IDs match each other, the first collation unit 33 determines that the collation is OK. In other words, when the operation of collation is normally performed, and the component ID accommodated in the arrangement data 35c is read out, the first collation unit 33 determines that the collation is OK. In other words, the first collation unit 33 receives the identification information which is read out by the identification information reading-out unit via the mounting line management apparatus 4, and performs the collation of the electronic component 13 accommodated in the accommodating body based on the received identification information.

Based on the operation information sent from the electronic component mounting apparatuses M2 to M4 via each of the mounting line management apparatuses 4, the first update unit 34 updates the operation data 36 or the component use history data 37. For example, the first update unit 34 sequentially updates the number of remaining electronic components 13 accommodated in the supply reel 15 by subtracting the number of used electronic components 13 included in the operation information from the number of remaining electronic components 13 indicated in the "remaining number" 37c of the component use history data 37.

As described above, the integrated management apparatus 2 is connected to the plurality of mounting line management apparatuses 4 to be accessible via the communication network 3, stores the production data 35 in each of the plurality of mounting lines 6, receives the operation information from the mounting line management apparatus 4, and integrally manages the plurality of mounting lines 6. In addition, the first update unit 34 updates the number of remaining electronic components 13 stored in the first storage unit (integrated data base 32) based on the operation information received from the mounting line 6 via the mounting line management apparatus 4.

The local data base 42 (second storage unit) provided in the mounting line management apparatus 4 stores unit component use history data 45 or the like, in addition to the production data 35 and the operation data 36 which correspond to the mounting line 6 of the connection tip. The unit component use history data 45 is data indicating the information regarding the electronic component 13 used in one mounting line 6 that is managed by each mounting line management apparatus 4, and is configured by associating the "component type", the "remaining number", and the "location" with the "component ID". Description of detailed contents of each item will be omitted since the description thereof is the same as that of the component use history data 37. Only the electronic component 13 which corresponds to the component ID read out by the barcode reader 18 is reflected as the "remaining number" indicated in the unit component use history data 45.

When the component ID is read out by the barcode reader 18, the second collation unit 43 performs the collation processing similarly to the above-described first collation unit 33 in a case where the mounting line management apparatus 4 cannot access the integrated management apparatus 2 due to a certain reason. In other words, each of the plurality of mounting line management apparatuses 4 performs the collation of the electronic component 13 accommodated in the accommodating body based on the identification information read out by the identification information reading-out unit. Here, when the mounting line management apparatus 4 cannot access the integrated management apparatus 2, a communication network error in which the mounting line management apparatus 4 cannot be connected to the integrated management apparatus 2, or a problem in the hardware or software of the integrated data base 32 of the integrated management apparatus 2, is assumed.

The second update unit 44 updates the number of remaining electronic components 13 which is indicated in the unit component use history data 45 based on the component use history data 37 stored in the integrated data base 32 or the operation information received from the mounting line 6 of the connection tip. Accordingly, the mounting line 6 is managed by the mounting line management apparatus 4.

As described above, the mounting line management apparatus 4 is disposed in each of the plurality of mounting lines 6, stores the production data 35 which is necessary for producing the substrate 10 in the mounting line 6 where the mounting line management apparatus 4 is disposed, receives the operation information from the mounting line 6, and manages the mounting line 6. In addition, the second update unit 44 updates the number of remaining electronic components 13 stored in the second storage unit (local data base 42) based on the information regarding the electronic component 13 stored in the first storage unit (integrated data base 32) included in the integrated management apparatus 2, or the operation information received from the mounting line 6.

The storage unit 52 provided in the electronic component mounting apparatuses M2 to M4 stores the mounting data 35a or the component data 35b read from the mounting line management apparatus 4. The mechanism driving unit 53 is controlled by the control device 50, and drives the substrate carrying mechanism 9, the tape feeder 12, the Y-axis beam 19Y, the X-axis beam 19X, the mounting head 20 and the like. Accordingly, carrying work, positioning work, and mounting work are performed for the substrate 10 as a target.

The display unit 54 is a display device, such as a monitor, and displays various types of guide screens which are necessary for the mounting work. The operation and input unit 55 is an input device, such as a keyboard or a mouse, and is used when an operator performs predetermined input.

Figure 6:
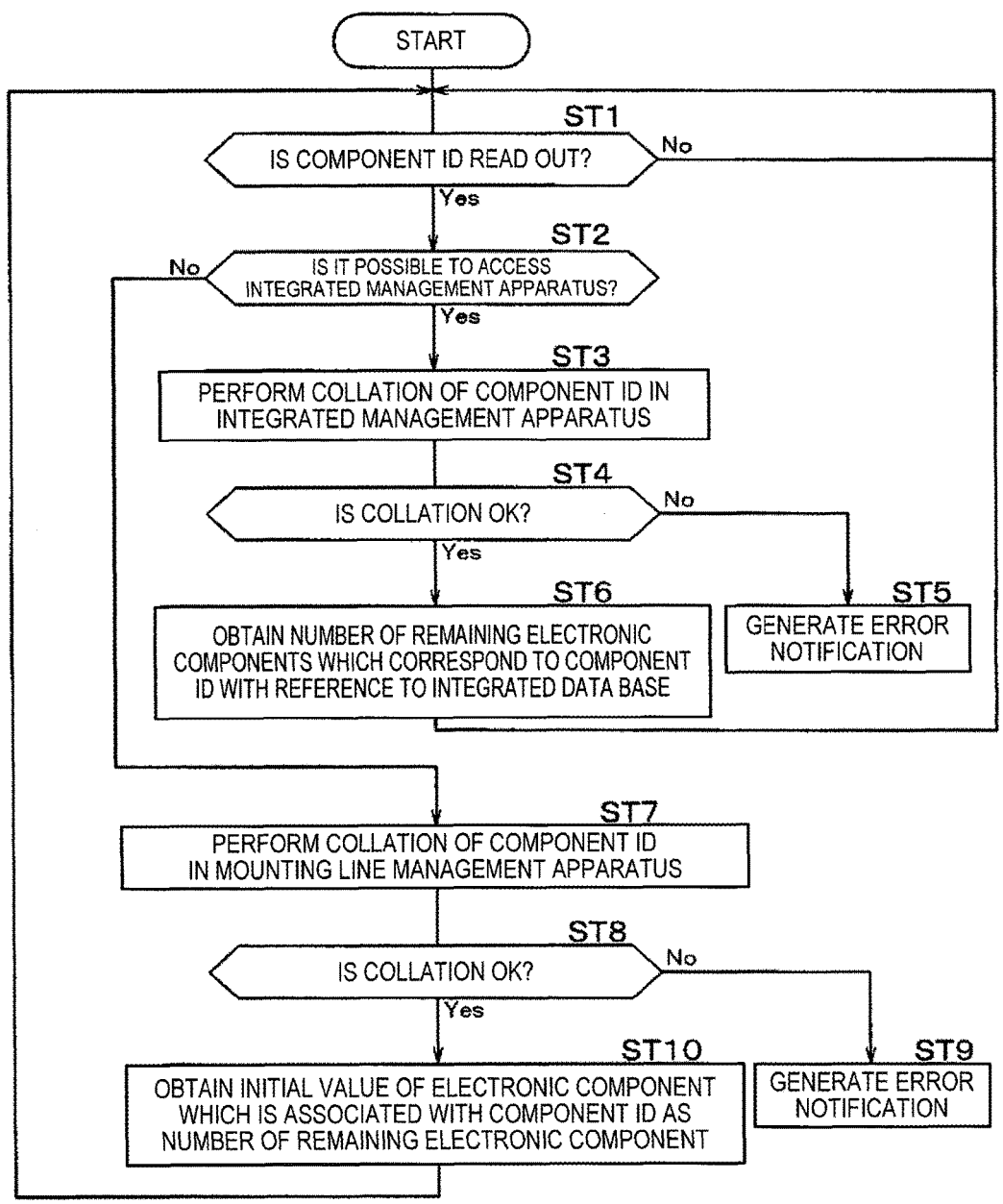
FIG. 6 is a flowchart illustrating a management method of an electronic component according to one embodiment of the present invention.

The electronic component mounting system 1 according to the embodiment is configured as described above. Next, with reference to FIG. 6, a management method of the electronic component 13 accommodated in the supply reel 15 will be described. In addition, the management of the electronic component 13 accommodated in the supply reel 15 indicates a series of processing collation the component ID which is performed when setting the supply reel 15 in the electronic component mounting apparatuses M2 to M4, and obtaining the number of remaining electronic components 13 accommodated in the set supply reel 15.

First, the mounting line management apparatus 4 determines whether or not the component ID is read out by the barcode reader 18 (ST1: reading-out determination process). The mounting line management apparatus 4 repeats (ST1) until the component ID is read out. When the component ID is read out, the mounting line management apparatus 4 determines that it is possible to access the integrated management apparatus 2 (ST2: access possibility determination process).

When it is determined that it is possible to access the integrated management apparatus 2 in (ST2), the integrated management apparatus 2 (first collation unit 33) performs the collation of the component ID (ST3: collation process), and determines whether or not the collation is OK (ST4: collation result determination process). Next, the mounting line management apparatus 4 inquires the integrated management apparatus 2 about the collation result, and when the collation is not OK, an indication which shows that the collation is not OK is displayed on the display unit 54, and the operator is notified of an error (ST5: error notification process).

In addition, when the collation is OK in (ST4), the mounting line management apparatus 4 obtains the number of remaining electronic components 13 which corresponds to the component ID (ST6: component remaining number obtaining process). Specifically speaking, the mounting line management apparatus 4 refers to the integrated data base 32, obtains the number of remaining electronic components 13 which correspond to the component ID from the component use history data 37. The obtained remaining number is written into the unit component use history data 45. Accordingly, the mounting work for the electronic component 13 corresponding to the component ID as a target, is possible. After obtaining the number of remaining electronic components 13 accommodated in the supply reel 15, the process returns to (ST1).

In addition, after obtaining the number of remaining electronic components 13 accommodated in the supply reel 15, the mounting work for the electronic component 13 as a target is performed in the electronic component mounting apparatuses M2 to M4. In addition, when the integrated management apparatus 2 and the mounting line management apparatus 4 are able to access each other, the integrated management apparatus 2 (first update unit 34) updates the number of remaining electronic components 13 indicated in the component use history data 37 which is stored in the integrated data base 32 based on the operation information received from the mounting line management apparatus 4. In other words, when the mounting line management apparatus 4 can access the integrated management apparatus 2, the number of remaining electronic components 13 accommodated in the supply reel 15 is updated by the first update unit 34. In addition, the mounting line management apparatus 4 refers to the integrated data base 32 after the update, and updates the number of remaining electronic components 13 stored in the local data base 42.

In addition, when it is not possible to access the integrated management apparatus 2 in (ST2), the mounting line management apparatus 4 performs the collation of the component ID (ST7: component collation process), and determines whether or not the collation is OK (ST8: collation result determination process). When the collation is not OK, the mounting line management apparatus 4 displays the result thereof on the display unit 54, and notifies the operator of the result as an error (ST9: error notification process).

In addition, when the collation is OK in (ST8), the mounting line management apparatus 4 obtains the initial value of the electronic component 13 which is associated with the component ID read out by the barcode reader 18, that is, the total number of electronic components 13 accommodated in the supply reel 15 before the use, as the number of remaining electronic components 13 (ST10: component remaining number obtaining process). After obtaining the number of remaining electronic components 13, the process returns to (ST1). In addition, the mounting work is performed based on the obtained number of remaining electronic components 13 in the electronic component mounting apparatuses M2 to M4.

The reason of obtaining the number of remaining electronic components 13 accommodated in the supply reel 15 by this method is as follows. In other words, in a situation where the mounting line management apparatus 4 cannot access the integrated management apparatus 2, the mounting line management apparatus 4 cannot refer to the integrated data base 32, and obtain the number of remaining electronic components 13 accommodated in the supply reel 15. In addition, the electronic component mounting apparatuses M2 to M4 cannot perform the mounting work until the number of remaining electronic components 13 accommodated in the supply reel 15 is obtained. For this reason, as the total number of electronic components 13 which is associated with the components ID is considered as the remaining number, the mounting work in the electronic component mounting apparatuses M2 to M4 can continue. In addition, in a situation where the mounting line management apparatus 4 cannot access the integrated management apparatus 2, when the newly set supply reel 15 is used in advance in other mounting line 6, that is, when the newly set supply reel 15 is a so-called in-process supply reel, there is an extremely high possibility that the number of remaining electronic components 13 obtained by the mounting line management apparatus 4 is incorrect. However, as described above, in the electronic component mounting apparatuses M2 to M4, it is possible to continue the production of the mounted substrate for the electronic component 13 accommodated in the supply reel 15 as a target. In this manner, when the mounting work is performed for the electronic component 13 in which the collation by the second collation unit 43 is finished as a target, the mounting line management apparatus 4 obtains the total number (initial value) of the electronic components 13 accommodated in the supply reel 15 as the remaining number.

Figure 7:
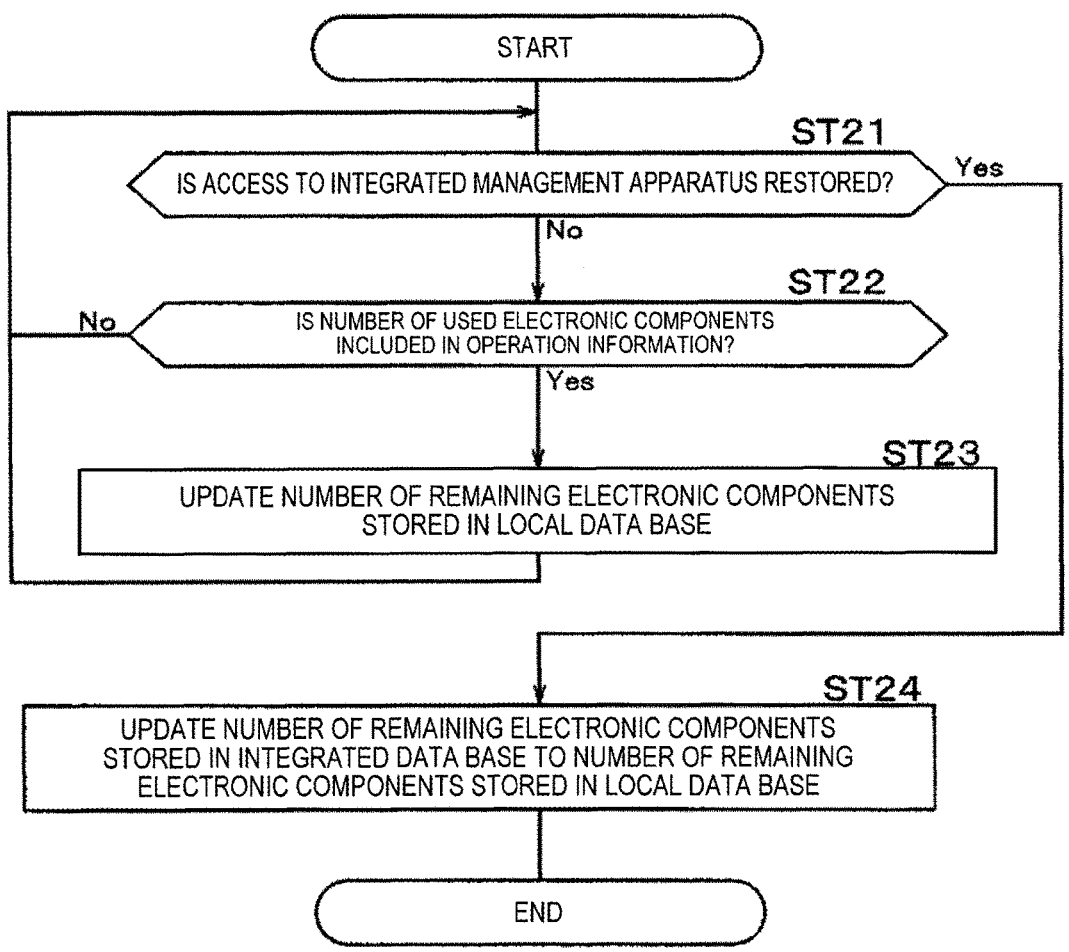
FIG. 7 is a flowchart illustrating update processing of the number of remaining electronic components according to one embodiment of the present invention.

Next, with reference to FIG. 7, a flow of update processing of the number of remaining electronic components 13 in which the collation of the component ID is performed by the second collation unit 43 in a situation where the mounting line management apparatus 4 cannot access the integrated management apparatus 2, will be described. First, the mounting line management apparatus 4 determines whether or not access to the integrated management apparatus 2 is restored (ST21: access restoration determination process). When access is not restored, the mounting line management apparatus 4 determines whether or not the number of used electronic components 13 accommodated in the supply reel 15, that is, the number of electronic components 13 mounted on the substrate 10, is included in the operation information sent from the mounting line 6 (ST22: electronic component use determination process). When the number of used electronic components 13 accommodated in the supply reel 15 is not included, the process returns to (ST21).

In addition, when the number of used electronic components 13 accommodated in the supply reel 15 is included in the operation information, the mounting line management apparatus 4 (second update unit 44) updates the number of remaining electronic components 13 indicated in the unit component use history data 45 which is stored in the local database 42 (ST23: remaining component amount update process). At this time, the mounting line management apparatus 4 subtracts the number of used electronic components 13 from the total number (initial value) of the electronic components 13 accommodated in the supply reel 15. If the number of electronic components 13 accommodated in the supply reel 15 is updated, the process returns to (ST21). In other words, when the mounting line management apparatus 4 cannot access the integrated management apparatus 2, the number of remaining electronic components 13 accommodated in the supply reel 15 is updated by the second update unit 44.

In addition, when access to the integrated management apparatus 2 is restored in (ST21), the mounting line management apparatus 4 sends the number of remaining electronic components 13 indicated in the unit component use history data 45 to integrated management apparatus 2. In addition, based on the received number of remaining electronic components 13, the integrated management apparatus 2 updates the number of remaining electronic components 13 indicated in the component use history data 37 which is stored in the integrated data base 32. In other words, the integrated management apparatus 2 updates the number of remaining electronic components 13 indicated in the component use history data 37 which is stored in the integrated data base 32, to the number of remaining electronic components 13 indicated in the unit component use history data 45 which is stored in the local data base 42 (ST24: component remaining number update process).

In this manner, when the identification information is read out by the identification information reading-out unit, the electronic component mounting system 1 according to the embodiment performs collation of the electronic components 13 accommodated in the supply reel 15 by the first collation unit 33 when the mounting line management apparatus 4 can access the integrated management apparatus 2, and performs collation of the electronic components 13 accommodated in the supply reel 15 by the second collation unit 43 when the mounting line management apparatus 4 cannot access the integrated management apparatus 2. In addition, as the electronic component mounting apparatuses M2 to M4 perform the mounting work for the electronic component 13 accommodated in the supply reel 15 in which the collation by the first collation unit 33 and the second collation unit 43 is finished as a target, even when the mounting line management apparatus 4 cannot access the integrated management apparatus 2, it is possible to continue the production of the substrate 10 (mounted substrate) without stopping the operation of the mounting line 6.

Figure 8:
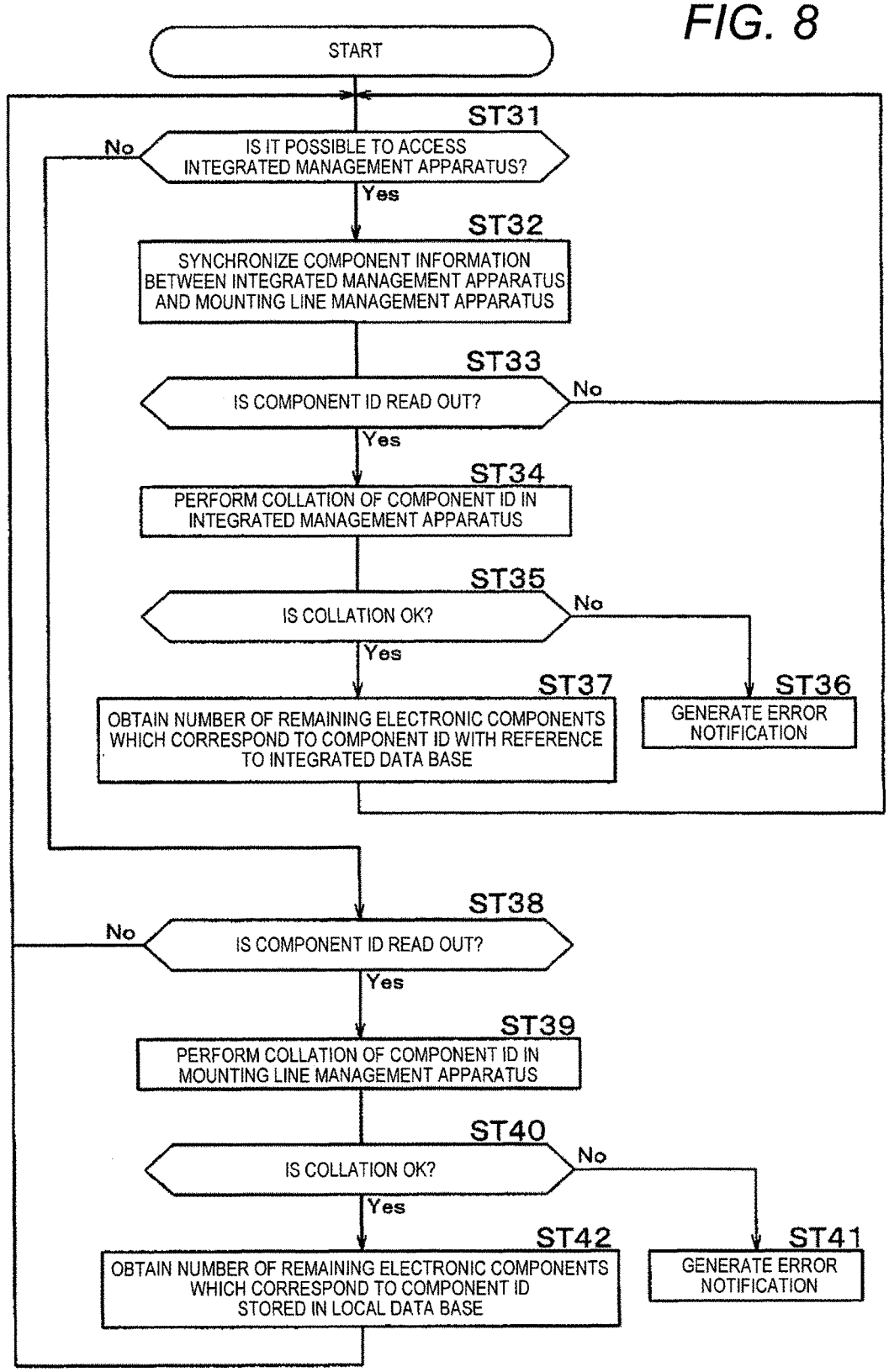
FIG. 8 is a flowchart illustrating a management method of the electronic component according to another embodiment of the present invention.

Next, with reference to FIG. 8, another example of the management method of the electronic component 13 accommodated in the supply reel 15 will be described. In the example, even when the in-process supply reel 15 is newly set in a situation where the mounting line management apparatus 4 cannot access the integrated management apparatus 2, the example is different from the above-described embodiment in that the number of remaining electronic components 13 accommodated in the supply reel 15 can be more accurately managed. In addition, the same processes as those of the embodiment will be briefly described.

First, the mounting line management apparatus 4 determines whether or not access to the integrated management apparatus 2 is possible (ST31: access possibility determination process). When access to the integrated management apparatus 2 is possible, the information (component information) of the electronic component 13 is synchronized between the integrated management apparatus 2 and the mounting line management apparatus 4 (ST32: synchronizing process). In other words, the mounting line management apparatus 4 refers to the integrated data base 32, and obtains the information regarding all of the electronic components 13 which are the targets to be mounted in the electronic component mounting apparatuses M2 to M4 of the connection tip, from the component use history data 37. In addition, the information regarding the electronic component 13 includes the remaining number. In addition, the mounting line management apparatus 4 rewrites the unit component use history data 45 based on the obtained information. Accordingly, the number of remaining electronic components 13 which corresponds to the component ID in which the collation processing has not yet been performed is stored in the local data base 42. In addition to this, the numbers of the remaining electronic components 13 which correspond to the component ID included in both the integrated data base 32 of the integrated management apparatus 2 and the local data base of the mounting line management apparatus 4 match each other. In addition, in this process (ST32), among the plurality of mounting line management apparatus 4, synchronization is performed between the integrated management apparatus 2 and all of the accessible mounting line management apparatuses 4.

Next, the mounting line management apparatus 4 determines whether or not the component ID is read out by the barcode reader 18 (ST33: reading-out determination process). When the component ID is not read out, the process returns to (ST31). In addition, when the component ID is read out, the integrated management apparatus 2 (first collation unit 33) performs the collation of the component ID (ST34: collation process), and determines whether or not the collation is OK (ST35: collation result determination process). When the collation is not OK, the mounting line management apparatus 4 notifies the operator of the error (ST36: error notification process). In addition, when the collation is OK, the mounting line management apparatus 4 refers to the integrated data base 32, and obtains the number of remaining electronic components 13 which corresponds to the component ID, from the component use history data 37 (ST37: component remaining number obtaining process). After obtaining the number of remaining electronic components 13 accommodated in the supply reel 15, the process returns to (ST31).

In addition, when it is not possible to access the integrated management apparatus 2 in (ST31), the mounting line management apparatus 4 determines whether or not the component ID is read out by the barcode reader 18 (ST38: reading-out determination process). When the component ID is not read out, the process returns to (ST31). In addition, when the component ID is read out, the mounting line management apparatus 4 (second collation unit 43) performs the collation of the component ID (ST39: collation process), and determines whether or not the collation is OK (ST40: collation result determination process). When the collation is not OK, the mounting line management apparatus 4 notifies the operator of the error (ST41: error notification process). In addition, when the collation is OK, the mounting line management apparatus 4 obtains the number of remaining electronic components 13 which correspond to the component ID, from the unit component use history data 45 stored in the local data base 42 (ST42: component remaining number obtaining process). After obtaining the number of remaining electronic components 13 accommodated in the supply reel 15, the process returns to (ST31).

After this, in the mounting work performed in the electronic component mounting apparatuses M2 to M4, by subtracting the number of used electronic components 13 accommodated in the supply reel 15 from the remaining number obtained in the above-described process (ST42), the number of remaining electronic components 13 is updated. In another example, before a state where the mounting line management apparatus 4 cannot access the integrated management apparatus 2, the component information including the number of remaining electronic components 13 accommodated in the supply reel 15 is synchronized between the integrated management apparatus 2 and the mounting line management apparatus 4. Therefore, even when the new supply reel 15 is set while the mounting line management apparatus 4 cannot access the integrated management apparatus 2, it is possible to more accurately obtain the number of remaining electronic components 13 accommodated in the supply reel 15, and to perform the management of the remaining amount.

Figure 9:
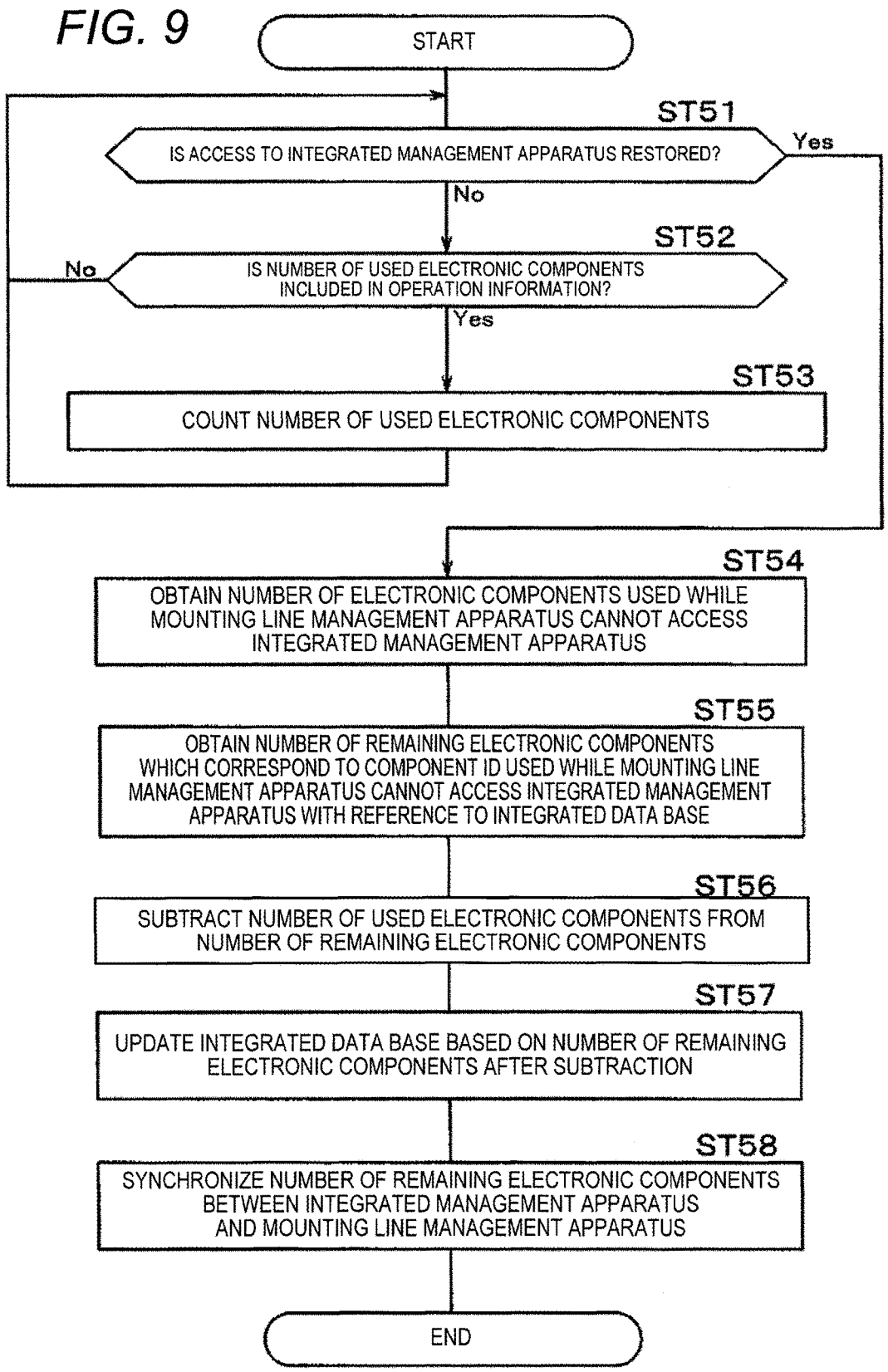
FIG. 9 is a flowchart illustrating update processing of the number of remaining electronic components according to another embodiment of the present invention.

Next, with reference to FIG. 9, a flow of the update processing of the number of remaining electronic components 13 in which the collation of the component ID is performed by the second collation unit 43 in a situation where the mounting line management apparatus 4 cannot access the integrated management apparatus 2 will be described. First, the mounting line management apparatus 4 determines whether or not access to the integrated management apparatus 2 is restored (ST51: access restoration determination process). When access is not restored, the mounting line management apparatus 4 determines whether or not the number of used electronic components 13 accommodated in the supply reel 15 is included in the operation information sent from the mounting line 6 (ST52: electronic component use determination process). When the number of used electronic components 13 accommodated in the supply reel 15 is not included, the process returns to (ST51). In addition, when the number of used electronic components 13 accommodated in the supply reel 15 is included, the mounting line management apparatus 4 counts the number of used electronic components 13 (ST53: counting process).

In addition, when access to the integrated management apparatus 2 is restored in (ST51), the mounting line management apparatus 4 sends the accumulated operation information to the integrated management apparatus 2. Based on the received operation information, the integrated management apparatus 2 obtains the number of used electronic components 13 while the mounting line management apparatus 4 cannot access the integrated management apparatus 2 (ST54: electronic component use number obtaining process). Next, the integrated management apparatus 2 refers to the integrated data base 32, and obtains the number of remaining electronic components 13 which correspond to the component ID used while the mounting line management apparatus 4 cannot access the integrated management apparatus 2, from the component use history data 37 (ST55: electronic component remaining number obtaining process).

Next, the integrated management apparatus 2 (first update unit 34) subtracts the number of used electronic components 13 obtained in (ST54) from the number of remaining electronic components 13 obtained in (ST55) (ST56: subtracting process). In other words, in (ST54) to (ST56), after a state where access between the mounting line management apparatus 4 and the integrated management apparatus 2 are is restored, the number of used electronic components 13 used in the mounting work performed in a situation where the integrated management apparatus 2 cannot access the mounting line management apparatus 4 is obtained, and the first update unit 34 subtracts the number of use from the number of remaining electronic components 13 stored in the first storage unit (integrated data base 32). Next, based on the number of remaining electronic components 13 after the subtraction, the integrated management apparatus 2 (first update unit 34) updates the integrated data base 32 (ST57: update process). Specifically, the integrated management apparatus 2 writes the number of remaining electronic components 13 after the subtraction into the component use history data 37.

Next, the number of remaining electronic components 13 accommodated in the supply reel 15 is synchronized between the integrated management apparatus 2 and the mounting line management apparatus 4 (ST58: synchronizing process). Specifically, the mounting line management apparatus 4 refers to the integrated data base 32, and obtains the number of remaining electronic components 13 accommodated in the supply reel 15 from the component use history data 37. In addition, based on the obtained number of remaining electronic components 13, the mounting line management apparatus 4 (second update unit 44) updates the unit component use history data 45. In other words, after a state where the mounting line management apparatus 4 can access the integrated management apparatus 2 is restored, the second update unit 44 updates the number of remaining electronic components 13 stored in the second storage unit (local data base 42), to the number of remaining electronic components 13 updated by the first update unit 34.

As described above, according to another example, the number of remaining electronic components 13 accommodated in the supply reel 15 is synchronized between the integrated management apparatus 2 and the mounting line management apparatus 4. Therefore, the mounting line management apparatus 4 cannot access the integrated management apparatus 2 due to a certain reason, and in the meantime, even when the in-process supply reel 15 is newly set in the electronic component mounting apparatuses M2 to M4, the mounting line management apparatus 4 can more accurately obtain the number of remaining electronic components 13 accommodated in the supply reel 15. As a result, in the electronic component mounting apparatuses M2 to M4 which are connected to the mounting line management apparatus 4, the mounting work can be continuously performed under more accurate management of the number of remaining electronic components 13.

Above, the present invention is described based on the embodiment. The embodiment is an example, and those skilled in the art understand that various modification examples are possible by combining each configuration element or each processing process, and the modification examples are within the scope of the present invention.

The identification information reading-out unit is described by using the barcode reader 18 provided in the electronic component mounting apparatuses M2 to M4, but for example, an identification unit or an imaging unit which is provided in a portable terminal, such as a tablet terminal, possessed by those skilled in the art, may be used as the identification information reading-out unit. In addition, in this case, the identification information which is read out from the communication unit of the tablet terminal is sent to the mounting line management apparatus 4.

In addition, in the mounting line management apparatus, the mounting line management apparatus (management system) is disposed in each mounting line for integrally managing the operation situations of each mounting line floor by floor, but the functions of the mounting line management apparatus may be provided in the component mounting apparatus.

According to the present invention, even when it is not possible to access the integrated management apparatus, it is possible to continue the production of the substrate without stopping the operation of the mounting line, and the present invention is efficient in an electronic component mounting field.

What is claimed is:

1. An electronic component mounting system, comprising:
   a plurality of mounting lines for mounting an electronic component onto a substrate;
   a plurality of mounting line management apparatuses which are disposed in each of the plurality of mounting lines, which store production data necessary for producing the substrate in the corresponding mounting line where the mounting line management apparatuses are disposed, which receive operation information from the corresponding mounting line, and which manage the corresponding mounting line;

an integrated management apparatus which is connected to the plurality of mounting line management apparatuses via a communication network, which stores the production data in each of the plurality of mounting lines, which receives the operation information from the plurality of mounting line management apparatuses, and which integrally manages the plurality of mounting lines; and an identification information reading-out unit which reads out identification information for identifying the electronic component from a recording medium attached to an accommodating body that accommodates the electronic component, wherein the integrated management apparatus comprises a first collation unit which performs collation of the electronic component accommodated in the accommodating body based on the identification information read out by the identification information reading-out unit, wherein each of the plurality of mounting line management apparatuses comprises a second collation unit which performs collation of the electronic component accommodated in the accommodating body based on the identification information read out by the identification information reading-out unit, and wherein when the identification information is read out by the identification information reading-out unit, the collation of the electronic component is performed by the first collation unit if the mounting line management apparatus can access the integrated management apparatus, and the collation of the electronic component is performed by the second collation unit if the mounting line management apparatus cannot access the integrated management apparatus.

2. The electronic component mounting system according to claim 1,
wherein each of the plurality of mounting line management apparatuses comprises component use history data including a total number of electronic components as a remaining number obtained when mounting process is performed for the electronic component in which the collation by the second collation unit is finished as a target.

3. The electronic component mounting system according to claim 1,
wherein the integrated management apparatus further includes:
a first storage unit which stores information regarding a number of remaining electronic components; and
a first update unit which updates the number of remaining electronic components stored in the first storage unit based on the operation information received from the mounting line via the mounting line management apparatus,
wherein each of the mounting line management apparatuses further includes:
a second storage unit which stores information regarding a number of remaining electronic components; and
a second update unit which updates the number of remaining electronic components stored in the second storage unit based on the operation information received from the mounting line, and
wherein the first update unit updates a number of remaining electronic components if the mounting line management apparatus can access the integrated management apparatus, and the second update unit updates the number of remaining electronic components if the mounting line management apparatus cannot access the integrated management apparatus.

4. The electronic component mounting system according to claim 3,
wherein the integrated management apparatus comprises component use history data including a number of electronic components used in the mounting system process which is performed in a situation where it is not possible to access the mounting line management apparatus and obtained after a state where access between the mounting line management apparatus and the integrated management apparatus is restored, and the first update unit updates the number of remaining electronic components by subtracting the number of used components from the number of remaining electronic components stored in the first storage unit.

5. The electronic component mounting system according to claim 3,
wherein the second update unit updates the number of remaining electronic components stored in the second storage unit, to the number of remaining electronic components updated by the first update unit, after a state where access between the mounting line management apparatus and the integrated management apparatus is restored.

6. The electronic component mounting system according to claim 1,
wherein the mounting line management apparatus determines when the component identification information is read out so that it can access the integrated management apparatus.

* * * * *